(12) United States Patent
Malrieu

(10) Patent No.: US 9,764,654 B2
(45) Date of Patent: Sep. 19, 2017

(54) METHOD OF MONITORING THE CAPACITIVE FILTER OF A BATTERY CHARGER

(75) Inventor: Julien Malrieu, Guyancourt (FR)

(73) Assignee: RENAULT s.a.s, Boulogne-Billancourt (FR)

( * ) Notice: Subject to any disclaimer, the term of this patent is extended or adjusted under 35 U.S.C. 154(b) by 374 days.

(21) Appl. No.: 14/343,649

(22) PCT Filed: Sep. 10, 2012

(86) PCT No.: PCT/FR2012/052019
§ 371 (c)(1),
(2), (4) Date: Mar. 7, 2014

(87) PCT Pub. No.: WO2013/038098
PCT Pub. Date: Mar. 21, 2013

(65) Prior Publication Data
US 2014/0217980 A1  Aug. 7, 2014

(30) Foreign Application Priority Data

Sep. 13, 2011  (FR) ...................................... 11 58163

(51) Int. Cl.
*H02J 7/00* (2006.01)
*H02J 7/14* (2006.01)
(Continued)

(52) U.S. Cl.
CPC ........... *B60L 11/1851* (2013.01); *B60L 3/003* (2013.01); *B60L 3/04* (2013.01); *B60L 11/1803* (2013.01);
(Continued)

(58) Field of Classification Search
USPC ........ 324/426, 429; 320/109, 137, 166, 101, 320/107, 117, 104, 103, 115, 134, 167;
(Continued)

(56) References Cited

U.S. PATENT DOCUMENTS 4,419,621 A * 12/1983 Becker ................... H02H 3/365
324/548
4,805,063 A * 2/1989 Kataoka ................. G01R 31/42
324/548
(Continued)

FOREIGN PATENT DOCUMENTS

CN       101 599 656       12/2009
FR         2 943 188        9/2010
(Continued)

OTHER PUBLICATIONS

International Search Report Issued Jul. 4, 2013 in PCT/FR12/052019 Filed Sep. 10, 2012.
(Continued)

*Primary Examiner* — Alexis Pacheco
(74) *Attorney, Agent, or Firm* — Oblon, McClelland, Maier & Neustadt, L.L.P.

(57) ABSTRACT

A device for charging a battery, or a battery of an electric traction automotive vehicle, based on a three-phase or single-phase power supply network, including a filtering stage including a capacitive assembly and configured to be connected to the power supply network. The device includes a mechanism to monitor capacitive assembly and to detect a deviation in value of the capacitance of at least one capacitor of the capacitive assembly on the basis of voltages and currents measured across the input terminals of the filtering stage.

13 Claims, 3 Drawing Sheets

(51) Int. Cl.
*B60L 11/18* (2006.01)
*H01M 10/44* (2006.01)
*H01M 10/48* (2006.01)
*H01M 8/04664* (2016.01)
*B60L 3/00* (2006.01)
*B60L 3/04* (2006.01)
*G01R 31/36* (2006.01)
*G01R 31/02* (2006.01)
*H02M 1/12* (2006.01)
*H02J 7/02* (2016.01)

(52) U.S. Cl.
CPC ....... *B60L 11/1809* (2013.01); *B60L 11/1812* (2013.01); *B60L 11/1816* (2013.01); *B60L 11/1824* (2013.01); *G01R 31/3644* (2013.01); *H01M 8/04686* (2013.01); *H01M 10/44* (2013.01); *H01M 10/48* (2013.01); *B60L 2240/529* (2013.01); *B60L 2250/10* (2013.01); *G01R 31/028* (2013.01); *H02J 7/022* (2013.01); *H02M 1/126* (2013.01); *Y02T 10/7005* (2013.01); *Y02T 10/7072* (2013.01); *Y02T 10/92* (2013.01); *Y02T 90/121* (2013.01); *Y02T 90/127* (2013.01); *Y02T 90/14* (2013.01)

(58) Field of Classification Search
USPC .................................................. 307/109, 9.1
See application file for complete search history.

(56) References Cited

U.S. PATENT DOCUMENTS

| | | | |
|---|---|---|---|
| 5,880,589 A | 3/1999 | Okano | |
| 6,043,999 A * | 3/2000 | Ehrenberg | H02J 3/1828 363/125 |
| 6,107,808 A * | 8/2000 | McKee | H02H 7/16 324/537 |
| 6,118,678 A * | 9/2000 | Limpaecher | H02M 5/4505 307/109 |
| 6,617,831 B2 * | 9/2003 | Perol | H02M 3/1584 320/101 |
| 6,677,637 B2 * | 1/2004 | Bernstein | H01G 4/1272 257/307 |
| 2004/0251881 A1 * | 12/2004 | Haydock | B60L 11/1803 322/24 |
| 2006/0072352 A1 | 4/2006 | Ghosh et al. | |
| 2006/0208707 A1 * | 9/2006 | Jacobson | H02M 5/271 320/166 |
| 2007/0040534 A1 | 2/2007 | Ghosh et al. | |
| 2007/0153560 A1 * | 7/2007 | Zhang | B60L 11/1811 363/166 |
| 2010/0321038 A1 * | 12/2010 | Dommaschk | H02M 7/483 324/658 |
| 2012/0286740 A1 * | 11/2012 | Loudot | B60L 11/1814 320/137 |
| 2013/0113279 A1 * | 5/2013 | Hatanaka | B60L 9/22 307/9.1 |

FOREIGN PATENT DOCUMENTS

| | | | | |
|---|---|---|---|---|
| JP | H09-257856 A | 10/1997 | | |
| JP | H10-142771 A | 5/1998 | | |
| JP | 2000-147039 A | 5/2000 | | |
| JP | 2007-236173 A | 9/2007 | | |
| JP | EP 2599656 A1 * | 6/2013 | ............... | B60L 9/22 |
| WO | WO 2010/103063 A1 | 9/2010 | | |

OTHER PUBLICATIONS

French Search Report Issued May 3, 2012 in Application No. FR 1158163 Filed Sep. 13, 2011.
Japanese Office Action dated Aug. 30, 2016 in Japanese Patent Application No. 2014-529056 (with Short Summary of Reasons for Rejection in English).

* cited by examiner

METHOD OF MONITORING THE CAPACITIVE FILTER OF A BATTERY CHARGER

The invention relates to means for filtering the input current of a high-voltage battery charging device, notably of a motor vehicle with electric traction, from a single-phase or three-phase power supply network, and more particularly to the monitoring of the state of the filtering means.

In high-voltage battery recharging systems, the electrical power of the network is brought to the battery in succession through two converters: a lowering converter ("buck") and a raising converter ("boost"). These two converters respectively make it possible to lower and raise the voltage ratio between their output terminal and their input terminal, by successively opening and closing a series of switches, at a frequency which is controlled as a function of the desired output current and/or output voltage.

Such recharging systems are, for example, described in the patent application FR 2 943 188 which relates to an embedded recharging system for a motor vehicle, making it possible to recharge a vehicle battery from a three-phase or single-phase circuit, the recharging circuit incorporating the coils of an electrical machine which also provides other functions such as current generation or vehicle propulsion.

The chopping of the current taken from the power supply network induces high-frequency components in the current taken, that is to say harmonics of an order higher than the fundamental of the distribution network, which is conventionally 50 Hz.

Since the electrical energy suppliers impose a standard on the harmonics of the current taken, such a recharging system also comprises filtering means of RLC (resistive-inductive-capacitive) type at the buck input stage.

The filtering means generally comprise and electromagnetic compatibility (EMC) filter as well as a capacitive-type filter comprising filtering capacitors in a "star" arrangement so as to provide filtering between each phase of the distribution network. The EMC filter is, for example, a filter with common mode inductances and capacitances making it possible to filter the current pulses generated by the transistors of the buck stage and of the boost stage of the recharging system. The filtering means thus make it possible to filter the absorbed current so that the current satisfies network connection constraints imposed by the network operators, in terms of harmonics, as well as those of the motor vehicle sector.

In the configuration that includes the neutral, the capacitive filter also comprises a neutral filtering capacitor arranged between the neutral wire and the common point of the filtering capacitors. This latter capacitor makes it possible to perform a filtering between the neutral wire and the phases.

However, such a capacitive filter can be degraded, for example in the case of degradation or aging of one or more capacitors. Such a degradation of the capacitive filter can then lead to ineffective filtering and an imbalance of the distribution network.

To monitor the capacitive filter, reference can be made to document U.S. Pat. No. 4,419,621 which describes a system that implements monitoring of a capacitive filter coupled to a battery. The monitoring system uses a frequency analysis of the signals. However, such a device is highly complex for simple fault detection.

Also known from the document U.S. Pat. No. 5,880,589 is a device that makes it possible to perform a diagnosis on an electrolytic capacitor in operation.

Reference can also be made to the document US 2010/0321038 which describes the use of a specific equation making it possible accurately to calculate the value of each capacitor of the system. However, such a device is also highly complex for simple fault detection, and is expensive.

The invention aims to mitigate the drawbacks mentioned above by proposing a simple and inexpensive monitoring device and method, that makes it possible to detect a possible deviation of one or more of the capacitors of the capacitive filter coupled to a single-phase or three-phase network so as to reduce the charge performance levels and inform the user that the capacitive filter should be replaced, or even prevent the charging of the battery of the electric vehicle if this deterioration is very significant.

According to one aspect, there is proposed, in one embodiment, a device for charging a battery, notably a battery of a motor vehicle with electric traction, from a three-phase or single-phase power supply network, comprising a filtering stage comprising a capacitive assembly and intended to be connected to the power supply network. In one embodiment, the device can comprise a buck stage connected to the filtering stage, and a boost stage intended to be connected to the battery and coupled to the buck stage.

According to a general feature, the device comprises means for monitoring the capacitive assembly capable of detecting a deviation in the capacitance value of at least one capacitor of the capacitive assembly from voltages and currents measured at the input of the filtering stage.

Preferably, the monitoring means comprise means for determining characteristic values of the measured voltages and currents, means for computing at least one parameter representative of the capacitive assembly from these voltage and current characteristic values, means for determining the state of the capacitors of the capacitive assembly from the computed representative parameter, and processing means suitable for delivering a control signal and/or a warning signal so as to alert the user to the degradation of the capacitive assembly.

The characteristic voltage and current values can be, for example, the rms values of these voltages and currents.

In one embodiment, the control signal is capable of provoking a limiting of the battery charge performance levels.

Advantageously, the means for determining the state of the capacitors can comprise at least one computation module capable of computing the absolute value of the difference between the representative parameter and a capacitive constant, and at least one comparison module capable of comparing said computed absolute value with a variation threshold.

The monitoring means can also comprise activation means capable of activating the monitoring means when the device is connected to the power supply network and before the start of the charging of the battery, the representative parameter being proportional, when the monitoring means are activated before the start of the charging of the battery, to the ratio between the rms current value of a first phase and the product of the frequency with the value of the rms voltage between the first phase and another phase.

Preferably, the monitoring means can comprise on-charge activation means capable of activating the monitoring means when the battery is on charge on a single-phase power supply network, the representative parameter corresponding, when the monitoring means are activated after the start of a charge on a single-phase network, to the ratio between, on the one hand, the difference between twice the square of the rms value of the power supply current and the square of the rms value of the current at the input of the buck stage, and, on the other hand, the product of the rms voltage at the terminals of the power supply network and of the frequency of the power supply network.

According to another aspect, there is proposed a motor vehicle with traction that is at least partially electrical, comprising an electrical machine coupled to drive wheels and an inverter stage capable of powering the electrical machine from a battery, characterized in that it comprises a device for charging the battery as defined above.

According to another aspect, there is proposed, in one implementation, a method for controlling a device for charging a battery, notably a battery of a motor vehicle with electric traction, from a three-phase or single-phase power supply network, in which at least one input voltage from said power supply network is filtered using a filtering stage comprising a capacitive assembly, the power supply current at the input of the filtering stage is measured, and the power supply voltage at the input of the filtering stage is measured.

According to a general feature, the state of the capacitors of the capacitive assembly is monitored on the basis of the variation of at least one parameter representative of the capacitive assembly from the voltages and currents measured at the input of the filtering stage.

Preferably, the method comprises a determination of the rms values of the measured voltages and currents, a computation of at least one parameter representative of the capacitive assembly from the rms voltage and current values, and a determination of the state of the capacitors of the capacitive assembly from the duly computed representative parameter, and a delivery of a control signal to limit the battery charge performance levels and of a warning signal so as to alert the user to the degradation of the capacitive assembly.

The determination of the state of the capacitors of the capacitive assembly can advantageously comprise at least one computation of the absolute value of the difference between a capacitive constant and one of said parameters representative of the capacitive assembly, and a comparison of the result of the computed subtraction with a variation threshold.

Preferably, the representative parameter corresponds, when the monitoring means are activated before the start of the charging of the battery, to the ratio between the value of the rms current of a first phase and the product of the frequency with the value of the rms voltage between the first phase and another phase, and, when the monitoring means are activated after the start of a charge on a single-phase network, to the ratio between, on the one hand, the difference between twice the square of the rms value of the power supply current and the square of the rms value of the current at the input of the buck stage, and, on the other hand, the product of the rms voltage at the terminals of the power supply network and the frequency of the power supply network.

Other advantages and features of the invention will become apparent on studying the detailed description of an implementation and of an embodiment, which are in no way limiting, and the appended drawings in which:

FIG. 1 schematically represents a device for charging a battery of a motor vehicle according to one embodiment;

Figure 1:
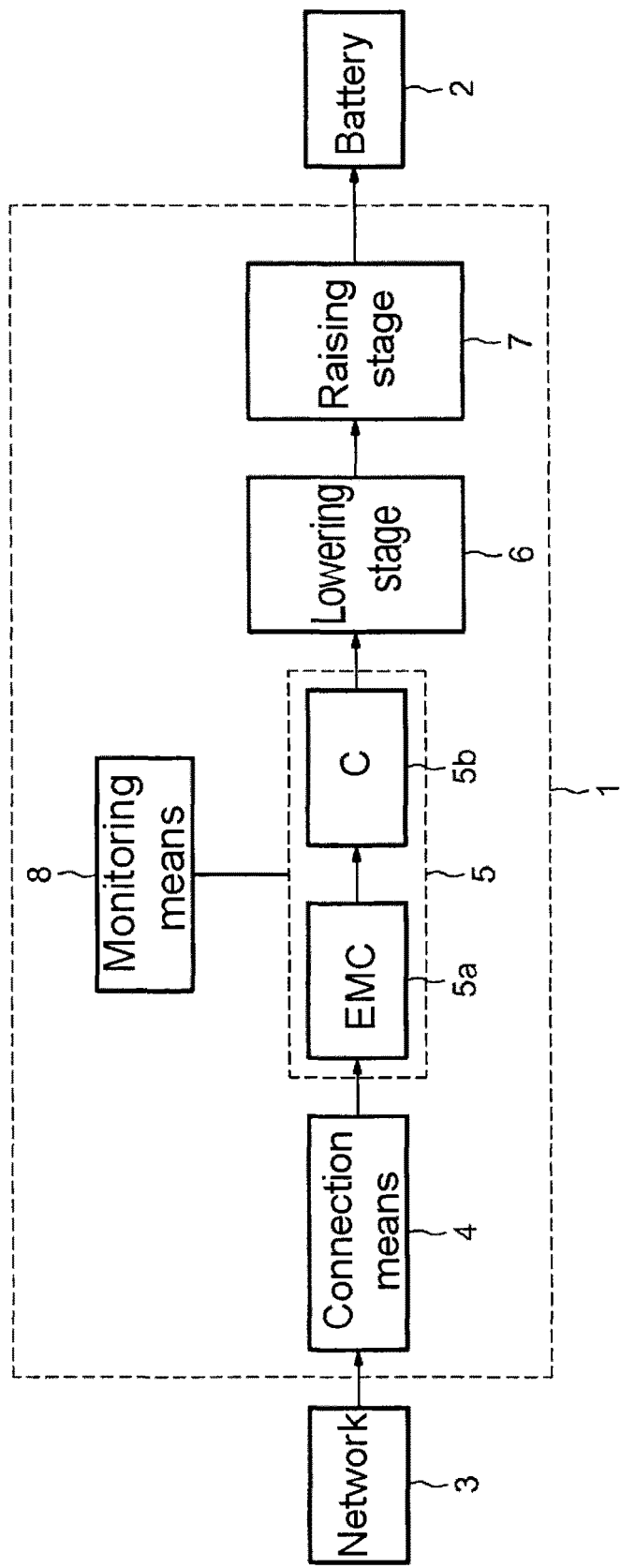

FIG. 1 shows, schematically, a device 1 for charging a battery 2 of a motor vehicle intended to be connected to a three-phase or single-phase power supply network 3 in order to recharge the battery 2.

The device 1 comprises connection means 4 making it possible to connect the charging device 1 to the power supply network 3, a filtering stage 5 for filtering the current from the power supply network 3 taken by the device 1, a buck stage 6 connected to the output of the filtering stage 5 and making it possible to rectify the alternating current obtained from the power supply network 3, and a boost stage 7 coupled between the buck stage 6 and the battery 2.

The filtering means 5 comprise an electromagnetic compatibility (EMC) filter 5a and a capacitive assembly 5b. The EMC filter 5a is, for example, a filter with common mode inductances and capacitances making it possible to filter the current pulses generated by the transistors of the buck 6 and boost 7 stages of the device 1. The filtering means 5 make it possible to filter the duly absorbed current so that the current satisfies the network connection constraints imposed by the network operators, in terms of harmonics, as well as those of the motor vehicle sector.

The capacitive assembly 5b comprises capacitors coupled in a so-called "star" arrangement so as to have two capacitors coupled between each phase. Instead of a so-called "star" arrangement of the capacitors, it is also possible to arrange the capacitors 5b in a so-called "delta" arrangement (not represented), that is to say arranging the capacitors between each phase and the neutral at the output of the EMC filtering means 5a. The value of the current which passes through them is thus reduced.

The device 1 also comprises means 8 for monitoring the capacitive assembly 5b capable of detecting a deviation of the value of at least one capacitor of the capacitive assembly 5b.

Figure 2:
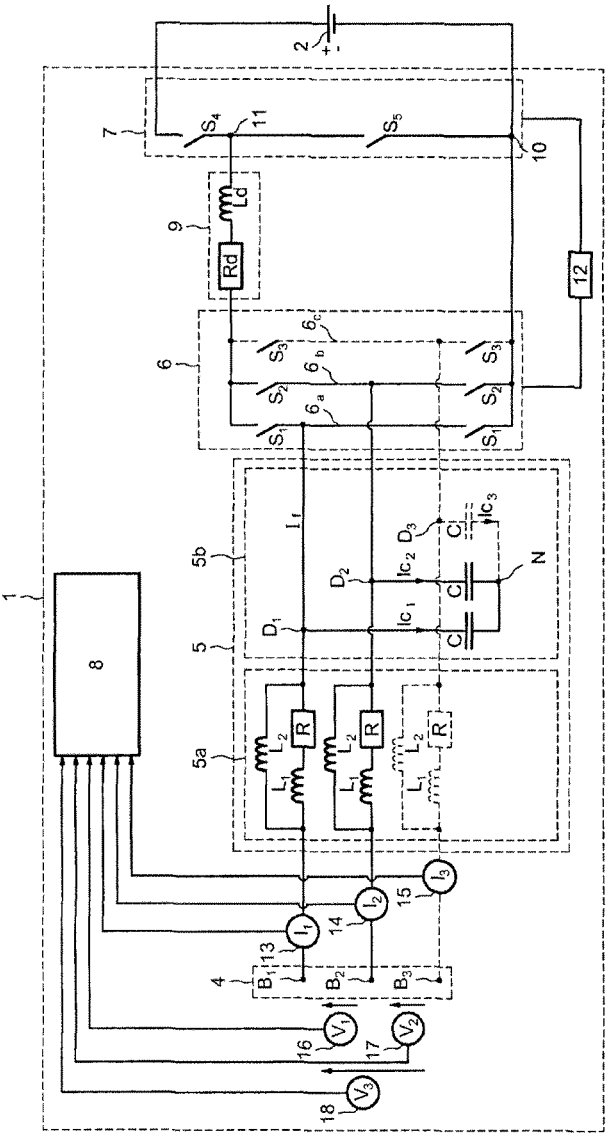
FIG. 2 illustrates, in more detail, one embodiment of the charging device of FIG. 1.

FIG. 2 illustrates, in more detail, the charging device of FIG. 1.

The boost stage 7 is connected to the buck stage 6 via an inductive element 9 symbolically represented in the figure by a resistor Rd arranged in series with an induction coil Ld.

Since the device 1 can be coupled to both a three-phase and a single-phase power supply, the connection means 4 comprise three terminals $B_1$, $B_2$, $B_3$ coupled at the input of the filtering stage 5, and capable of being coupled to the power supply network 3. In three-phase recharging mode, the three terminals $B_1$, $B_2$, $B_3$ are coupled to a three-phase power supply network. In single-phase recharging mode, only the inputs $B_1$ and $B_2$ are coupled to a single-phase power supply network delivering an input voltage Vi and an input current L. Each input terminal $B_1$, $B_2$ and $B_3$ is connected to a filtering branch of the EMC filter 5a. Each filtering branch of the EMC filter 5a comprises two parallel branches, one bearing an inductor of value $L_2$ and the other bearing, in series, an inductor of value Li and a resistor of value R.

These two filtering branches are each coupled at the output to a capacitor of capacitance C of the capacitive assembly 5b also coupled to the ground, at points respectively named $D_1$, $D_2$, $D_3$ for each of the filtering branches of the EMC filter 5a. The different capacitors of capacitance C are all linked to a common point or neutral point denoted N in FIG. 2. The assembly of the resistors of values R, of the inductors of values Li or $L_2$, and of the capacitors of capacitance C constitutes a filter of RLC type at the buck stage 3 input.

In single-phase recharging mode, the terminal $B_3$ is not coupled to the power supply network. Since the branch coupled to terminal $B_3$ is considered only in the case of a three-phase recharge, the latter is represented by broken lines. The other elements of the electrical circuit represented by broken lines are elements which are used only in the context of a coupling to a three-phase power supply network.

The buck stage 6 is coupled to the filtering stage 5 by the points $D_1$, $D_2$ and $D_3$. The latter comprises three parallel branches 6a, 6b and 6c each bearing two switches Si, $S_2$ or $S_3$, controlled by a control unit 12.

The common ends of the branches 6, 7 and 8 constitute two output terminals of the buck stage 6. One of the terminals is linked to the "−" terminal of the battery 2 and to a first input 10 of the boost stage 7. The other of these terminals is connected to a first terminal of the electrical machine 9, the other terminal of which is connected to a second input 11 of the boost stage 7.

The boost stage 7 comprises two switches $S_4$ and $S_5$ that can be driven by the control unit 12 independently. These two switches $S_4$ and $S_5$ are situated on a branch linking the first input 10 of the boost stage 7 and the "+" terminal of the battery 2. The second input 11 of the boost stage 7, to which the electrical machine 9 is connected, is connected between the two switches $S_4$ and $S_5$, the switch $S_4$ being coupled between the second input 11 and the "+" terminal of the battery 2, and the switch $S_5$ being coupled between the first input 10 and the second input 11.

The device 1 comprises a first current sensor 13, a second current sensor 14, and a third current sensor 15 capable of measuring, respectively, the current L circulating on the branch coupled to the first terminal $B_1$, the current $I_2$ circulating on the branch coupled to the second terminal $B_2$, and the current $I_3$ circulating on the branch coupled to the third terminal $B_3$.

The device also comprises a first voltage sensor 16, a second voltage sensor 17, and a third voltage sensor 18 which are capable of measuring, respectively, the voltage Vi between the first terminal Bi and the second terminal $B_2$, the voltage $V_2$ between the second terminal $B_2$ and the third terminal $B_3$, and the voltage $V_3$ between the first terminal Bi and the third terminal $B_3$.

The voltage sensors 16 to 18, and the current sensors 13 to 15 are coupled to the monitoring means 8 of the device. In the case of a recharge on a single-phase power supply network, only the measurement from the first current sensor 13 and the measurement from the first voltage sensor 16 are used to monitor the state of the capacitors of capacitance C of the capacitive assembly 5b. It will be noted that the measurement from the current sensor 14 can be used in the place of the measurement from the current sensor 13 in the event of failure thereof.

Figure 3:
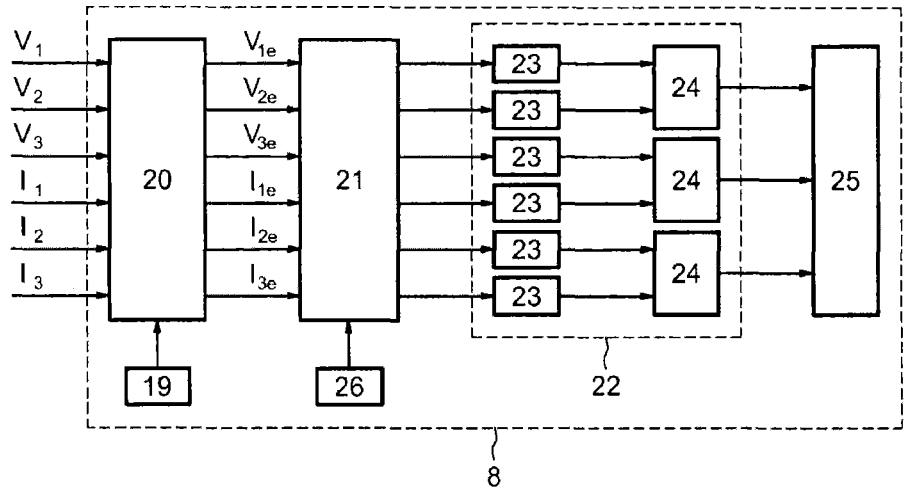
FIG. 3 illustrates, in more detail, the means for monitoring the charging device of FIG. 1.

FIG. 3 illustrates, in more detail, the monitoring means 8 of the device 1 for charging a battery 2 of FIG. 1.

The monitoring means 8 comprise activation means 19 capable of activating the monitoring means 8 when the device is connected to the power supply network 3 and before charging has begun.

The monitoring means 8 comprise means 20 for determining rms values receiving as input the values of the voltages Vi, $V_2$, $V_3$ measured respectively by the first, second and third voltage sensors 16, 17, 18 and the intensities of the currents Ii, $I_2$, $I_3$ measured respectively by the first, second and third current sensors 13, 14, 15. The means 20 for determining rms values deliver as output rms values $V_{1e}$, $V_{2e}$, $V_{3e}$ of the voltages $V_i$, $V_2$, $V_3$ as well as the rms values $I_{1e}$, $I_{2e}$, $I_{3e}$ of the currents L, $I_2$, $I_3$.

The activation means 19 are connected to the determination means 20 so that, as soon as a current measurement corresponding to the connection of a power supply network 3 to the charging device 1 is delivered by one of the current sensors 13 to 15 to the determination means 20, the activation means activate the determination means 20.

The monitoring means 8 comprise computation means 21 for computing at least one parameter representative of the capacitive assembly 5b coupled at the output to means 22 for determining the state of the capacitors of capacitance C of the capacitive assembly 5b from the computed representative parameters.

The computation means 21 receive as inputs the rms voltage values $V_{1e}$, $V_{ee}$, $V_{3e}$, and current values $I_{1e}$, $I_{2e}$, $I_{3e}$, and compute, for each phase, that is to say for each branch coupled to a terminal $B_1$, $B_2$ or $B_3$, at least one parameter representative of the capacitive assembly 5b.

In the case where the charging device 1 is connected to a three-phase power supply network 3, the monitoring means 8 are activated before the start of the charging of the battery 2 by the activation means 19. At this point, L=$I_{c1}$, $I_2$=$I_{c2}$, $I_3$=$I_{c3}$ (see in particular FIG. 2). Since the capacitive assembly 5b constitutes a balanced system, that is to say the capacitors coupled between two phases have the same value as the capacitors coupled between each other pair of phases, the following relationship is borne out for each phase:

$$\frac{I_e}{f \cdot V_e} = k \cdot \pi \cdot C = est$$

With / being the (measured) frequency of the current distributed by the power supply network 3, $I_e$ being the rms value of the current of a phase (that is to say $I_{e1}$, $I_{e2}$, or $I_{e3}$) $V_e$ being the rms value of the voltage between two phases including this phase, k being a coefficient dependent on the EMC filter 5a, and C being the value of the equivalent capacitance coupled between the two phases. In a balanced system, all the capacitances being equal, the term $_{k\pi C}$ is constant unless a capacitor has become defective. The term $_{k\pi C}$ is consequently called capacitive constant. This term is obtained by calibration in a preliminary step.

To check the state of the capacitor coupled between the first phase on which the current $I_i$ circulates and the neutral point, the computation means 21 compute the following pair of representative parameters:

$$\frac{I_{1e}}{f \cdot V_{1e}} \text{ and } \frac{I_{1e}}{f \cdot V_{3e}}$$

Similarly, to check the state of the capacitor coupled between the second phase on which the current $I_2$ circulates and the ground, the computation means 21 compute the following pair of representative parameters:

$$\frac{I_{2e}}{f \cdot V_{2e}} \text{ and } \frac{I_{2e}}{f \cdot V_{1e}}$$

And, to check the state of the capacitor coupled between the third phase on which the current $I_3$ circulates and the neutral point, the computation means compute the following pair of representative parameters:

$$\frac{I_{3e}}{f \cdot V_{3e}} \text{ and } \frac{I_{3e}}{f \cdot V_{2e}}$$

The three pairs of parameters representative of the state of the capacitive assembly 5b are transmitted to the means 22 for determining the state of capacitors C of the capacitive assembly 5b. The use of a pair of representative parameters for each phase makes it possible to determine which capacitor of the capacitive assembly 5b is defective.

The determination means 22 comprise, for each representative parameter received, a computation module delivering as output the absolute value of the result of the difference between the representative parameter and the capacitive constant $k\pi C$, i.e.:

$$\left| \frac{I_e}{f \cdot V_e} - k \cdot \pi \cdot C \right|$$

For each phase, a pair of absolute values is thus obtained and delivered to a comparator 24. Each absolute value of the pair is compared to a variation threshold. If at least one absolute value of the result is greater than the variation threshold, the capacitor C coupled between the phase and the neutral point is degraded.

The three comparators 24 are coupled at the output to a processing module 25 capable of delivering as output a control signal for limiting the charge performance levels of the battery 2 and a warning signal so as to alert the user to the degradation of the capacitive assembly 5b and the need to change it.

In the case where the charging device 1 is connected to a single-phase power supply network 3 by the terminals Bi and $B_2$, a single representative parameter is computed by the computation means 21:

$$\frac{I_{1e}}{f - V_{1e}}$$

This representative parameter is delivered by the computation means 21 to a computation module 23 to compute the absolute value:

$$\left| \frac{I_{1e}}{f \cdot V_{1e}} - k \cdot \pi \cdot C \right|$$

The duly computed absolute value is delivered to a comparator 24 so as to be compared to the variation threshold. If the absolute value is less than the variation threshold, the capacitors of capacitance C coupled between the two phases are not considered to be degraded. Otherwise, a signal is delivered to the processing module 25 to control a limiting on the charge and the warning to the user.

In the case where the device is connected to a single-phase power supply network 3, it is also possible to perform monitoring while the battery 2 is on charge. For this, the monitoring means comprise an on-charge activation module 26 capable of controlling the computation means 21.

In the case where the battery 2 is on charge, the following relationship is borne out:

$$\bar{I} = \bar{I}_f + \frac{C}{2} \cdot \frac{d\bar{U}_c}{dt}$$

With $I_f$ being the current circulating between the point Di and the buck stage 6, and $U_c$ being the voltage at the terminals of the two capacitors coupled between the terminals Bi and $B_2$. The control unit 12 drives the charging of the battery such that $U_c$ and $I_f$ are in phase. $I_f$ being driven, its value is known and corresponds to a software datum.

Since the current $I_f$ and the voltage $U_c$ are in phase, the previous relationship can be written:

$$\bar{I} - \sin(\omega t - \phi) = \overline{I_f} - \sin(\omega t) + \frac{\omega C k V_1}{2} \cos(\omega t)$$

$\phi$ being a phase offset due to the EMC filter and with the approximation: $U_c = kVi$.

By considering the rms current and voltage values, the following expression can be deduced therefrom:

$$C^2 \pi^2 k^2 f^2 = \frac{2 I_{1e}^2 - I_{fe}^2}{V_{1e}^2}$$

With $f$ being the frequency of the current distributed by the single-phase power supply network 3, Iu being the rms value of the current at the input of the filtering means 5, Vu being the rms value of the voltage between the two terminals Bi and $B_2$, and k being a coefficient dependant on the EMC filter 5a.

To monitor the state of the capacitive assembly 5b during a charge from a single-phase power supply network 3, the computation means 21 activated by the on-charge activation module 26 computes the following representative parameter:

$$\frac{2 I_{1e}^2 - I_{fe}^2}{V_{1e}^1}$$

This representative parameter is then delivered to a computation module 23 which computes the following absolute value:

$$\left| \frac{2 I_{1e}^2 - I_{fe}^2}{V_{1e}^2} - C^2 \pi^2 k^2 f^2 \right|$$

The duly computed absolute value is delivered to a comparator 24 to be compared to a variation threshold. If the absolute value is greater than the variation threshold, one of the capacitors C coupled between the two terminals Bi and $B_2$ is degraded.

When a degradation of a capacitor is thus detected by at least one comparator 24, the processing module 25 delivers as output a control signal for limiting the charge performance levels of the battery 2 and a warning signal so as to alert the user to the degradation of the capacitive assembly 5b and the need to change it.

Figure 4:
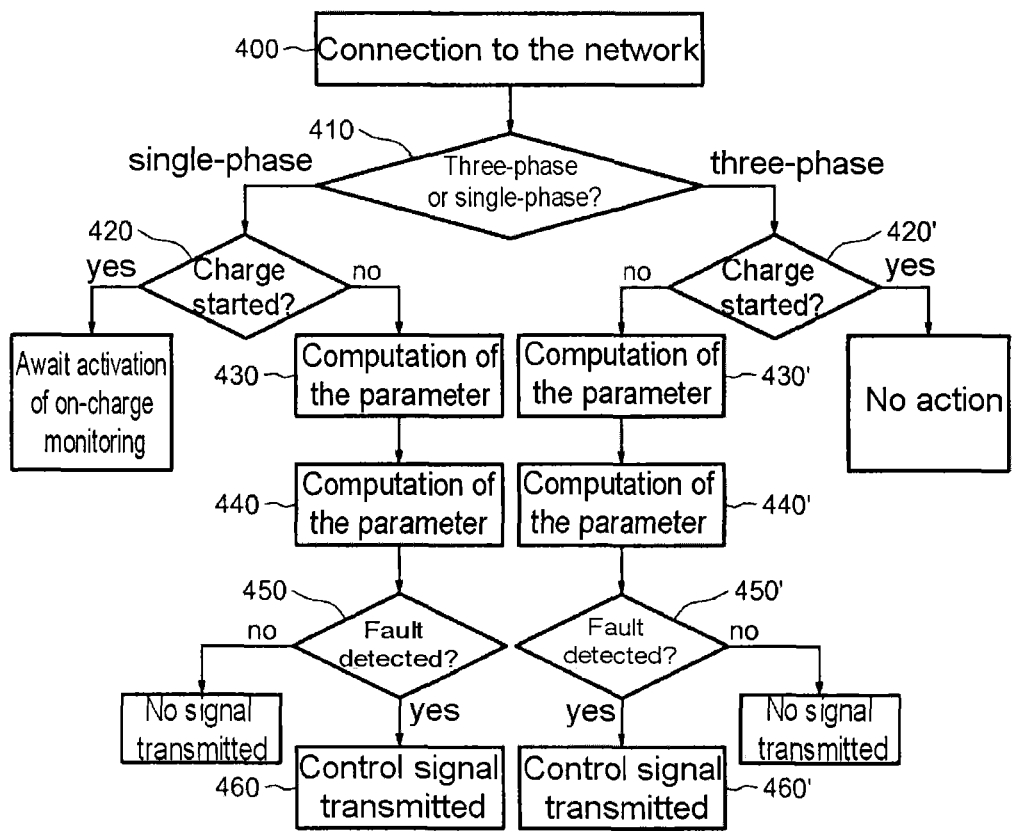
FIG. 4 shows a flow diagram of a method for controlling the charging device according to one implementation.

FIG. 4 schematically shows a flow diagram of a method for controlling a charging device (1) according to one implementation.

In a first step 400, the connection of the charging device to a power supply network 3 is detected by virtue of the measurements of current and voltage at the input terminals $B_1$, $B_2$, $B_3$ of the device 1 produced by the current sensors 13 to 15 and the voltage sensors 16 to 18.

In a subsequent step 410, a determination is made, from the voltage and current measurements, as to whether the connected power supply network 3 is a single-phase power supply network is three-phase or single-phase.

In a subsequent step 420 in the case of a single-phase network and 420' in the case of a three-phase network, a determination is made as to whether the charging of the battery 2 has begun. If it has not begun, in a subsequent step 430 in the case of a single-phase network and 430' in the case of a three-phase network, the monitoring means 8 are activated and a representative parameter is computed if the power supply network is single-phase 3, and three pairs of representative parameters are computed if the power supply network 3 is three-phase.

In a subsequent step 440, in the case of a single-phase network, and 440' in the case of a three-phase network, the absolute value of the difference between the representative parameter or parameters and the capacitive constant is computed.

In a subsequent step 450, in the case of a single-phase network and 450' in the case of three-phase network, the existence of a degradation of a capacitor is detected from the comparison of the computed absolute value or values to a variation threshold.

In the case of a single-phase network, if the computed absolute value is greater than the variation threshold, then, in a subsequent step 460, at least one capacitor of the capacitive assembly 5b is degraded and a control signal is delivered to limit the charge performance levels of the battery 2. A warning signal is delivered so as to alert the user to the degradation of the capacitive assembly 5b.

In the case of a three-phase network, if at least one absolute value of a pair of representative parameters is greater than the variation threshold, then the capacitor of the capacitive assembly 5b coupled between the phase considered and the neutral point is degraded. In a subsequent step 460', a control signal is delivered to limit the charge performance levels of the battery 2 and a warning signal is delivered so as to alert the user to the degradation of the capacitive assembly 5b.

If no defect is detected no signal is transmitted.

If, in the step 420, it is detected that the charging of the battery 2 has already begun, there is a wait for the activation of the on-charge monitoring by the on-charge activation means 26. In the case of a connection to a three-phase power supply network (step 420'), no on-charge monitoring is carried out.

The invention thus proposes a monitoring device and method that are simple and inexpensive, that make it possible to detect a possible deviation of one or more of the capacitors of the capacitive filter coupled to a single-phase or three-phase network so as to reduce the charge performance levels and inform the user that the capacitive filter must be replaced, or even to prevent the charging of the battery of the electric vehicle if this deterioration is very significant.

The invention claimed is:

1. A device for charging a battery of a motor vehicle with electric traction, from a three-phase or single-phase power supply network, the device comprising:
   filtering circuitry, which includes a capacitive assembly, configured to be connected to the three-phase or single-phase power supply network; and
   circuitry configured to monitor the capacitive assembly and to detect a deviation in a capacitance value of at least one capacitor of the capacitive assembly from voltages and currents measured only at an input of the filtering circuitry.

2. The device as claimed in claim 1, further comprising:
   buck circuitry connected to the filtering circuitry; and
   boost circuitry configured to be connected to the battery and coupled to the buck circuitry.

3. The device as claimed in claim 1, wherein the circuitry is configured to:
   determine characteristic values of the measured voltages and currents;
   compute at least one parameter representative of the capacitive assembly from the determined characteristic values of the measured voltages and currents;
   determine a state of the at least one capacitor of the capacitive assembly from the at least one parameter representative of the capacitive assembly; and
   deliver a control signal and/or a warning signal to alert a user to degradation of the capacitive assembly based on the determined state of the at least one capacitor.

4. The device as claimed in claim 3, wherein the characteristic values of the measured voltages and currents are rms values.

5. The device as claimed in claim 3, wherein the control signal is to limit battery charge performance levels.

6. The device as claimed in claim 3, wherein the circuitry is configured to:
   compute a difference between the at least one parameter representative of the capacitive assembly and a capacitive constant, and
   compare the computed difference with a variation threshold.

7. The device as claimed in claim 1,
   wherein the circuitry is configured to activate when the device is connected to the three-phase or single-phase power supply network and before a start of charging of the battery, and
   wherein at least one parameter representative of the capacitive assembly is proportional, when the circuitry is activated before the start of the charging of the battery, to a ratio between rms current value of a first phase and a product of frequency with a value of rms voltage between the first phase and another phase.

8. The device as claimed in claim 2,
   wherein the circuitry is configured to activate when the battery is being charged by the single-phase power supply network, and
   wherein at least one parameter representative of the capacitive assembly corresponds, when the circuitry is activated after a start of a charge on the single-phase power supply network, to a ratio between a difference between twice a square of rms value of power supply current and a square of the rms value of current at an input of the buck circuitry and a product of rms voltage at terminals of the single-phase power supply network and frequency of the single-phase power supply network.

9. A motor vehicle with traction that is at least partially electrical, comprising:
   an electrical machine coupled to drive wheels of the motor vehicle and an inverter stage configured to power the electrical machine from the battery; and
   the device for charging the battery as claimed in claim 1.

10. A method for controlling a device for charging a battery of a motor vehicle with electric traction, from a three-phase or single-phase power supply network, the method comprising:

filtering at least one input voltage from the three-phase or single-phase power supply network using a filtering stage including a capacitive assembly;

measuring a power supply current at an input of the filtering stage;

measuring a power supply voltage at the input of the filtering stage; and monitoring a state of capacitors of the capacitive assembly based on a variation of at least one parameter representative of the capacitive assembly from only the voltages and currents measured at the inputs of the filtering stage.

11. The method as claimed in claim 10, further comprising:

determining rms values of the measured voltages and currents;

computing at least one parameter representative of the capacitive assembly from the determined rms voltage and current values;

determining a state of the capacitors of the capacitive assembly from the computed at least one parameter representative of the capacitive assembly; and delivering a control signal to limit battery charge performance levels and a warning signal to alert a user to degradation of the capacitive assembly based on the determined state of the capacitors.

12. The method as claimed in claim 11, wherein said determining the state of the capacitors of the capacitive assembly includes at least one computation of an absolute value of a difference between a capacitive constant and the at least one parameter representative of the capacitive assembly, and a comparison of the at least one computed absolute value with a variation threshold.

13. The method as claimed in claim 10, wherein the at least one parameter representative of the capacitive assembly corresponds, when said monitoring the state of capacitors of the capacitive assembly is activated before a start of charging of the battery, to a ratio between a value of rms current of a first phase and a product of frequency with a value of rms voltage between the first phase and another phase, and, when said monitoring the state of capacitors of the capacitive assembly is activated after a start of a charge on the single-phase network, to a ratio between a difference between twice a square of an rms value of power supply current and a square of the rms value of current at an input of a buck stage and a product of the rms voltage at terminals of the single-phase power supply network and frequency of the single-phase power supply network.

* * * * *